(12) United States Patent
Tsai et al.

(10) Patent No.: US 6,299,218 B1
(45) Date of Patent: Oct. 9, 2001

(54) CONNECTING STRUCTURE BETWEEN FLUID CHANNEL

(75) Inventors: Pei-Wei Tsai; Hua-Jen Tseng, both of Chu Pei; Chun-Chieh Lee, Hsinchu; Gwo-Yuh Yang, Tainan Hsien, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/262,065

(22) Filed: Mar. 4, 1999

(51) Int. Cl.$^7$ ...................................................... F16L 27/00
(52) U.S. Cl. ........................ 285/184; 285/374; 285/231; 285/234
(58) Field of Search ................................... 285/374, 231, 285/234, 184

(56) References Cited

U.S. PATENT DOCUMENTS

| | | | | |
|---|---|---|---|---|
| 1,562,142 | * | 11/1925 | Braczik | 285/374 |
| 4,341,405 | * | 7/1982 | Olson | 285/234 |
| 5,941,070 | * | 8/1999 | Oldham | 285/231 |
| 5,984,001 | * | 11/1999 | Welkey | 285/374 |

FOREIGN PATENT DOCUMENTS

| | | | | |
|---|---|---|---|---|
| 0173488 | * | 2/1935 | (CH) | 285/374 |
| 0404314 | * | 6/1966 | (CH) | 285/374 |

* cited by examiner

*Primary Examiner*—Lynne H. Browne
*Assistant Examiner*—Aaron Dunwoody
(74) *Attorney, Agent, or Firm*—Nath & Associates PLLC; Harold L. Novick

(57) ABSTRACT

A structure for connecting fluid channel of fluid delivery system is disclosed. This connecting structure limits the length of the flow-guiding pipe extending into the delivery channel, to reduce particle contaminates and the probability of crack. The present pipe union connecting structure comprises a first pipe, a second pipe mounted to the first pipe, and an inner pipe extending from the first pipe into the second pipe with a certain extending length. The extending length of the inner pipe is less than the proportion of the minimum distance between the inner wall of the second pipe and the outlet of the inner pipe when standstill, to the tangent value of a certain angle θ, which is the maximum inclined angle between the second pipe and the inner pipe.

12 Claims, 5 Drawing Sheets

US 6,299,218 B1

CONNECTING STRUCTURE BETWEEN FLUID CHANNEL

BACKGROUND OF THE INVENTION

1. Field of the Invention

The present invention relates to semiconductor equipment, and more especially, to a pipe union structure connection between fluid channel.

2. Description of the Prior Art

In the semiconductor industry, there usually takes a lot of processes to fabricate a chip. Some of these processes, such as physical vapor deposition (PVD), chemical vapor deposition (CVD), and plasma etching (dry etching), need to process a gas, or vapor reaction, and therefore, need a fluid delivery system to deliver the reactive gas and/or precursor material into the processing chamber.

FIG. 1 depicts concisely a portion of a gas delivery system used to bring plasma gas into a wafer process chamber 10 in a photoresist stripping system, wherein the photoresist on the wafer 20 is stripped by plasma etching. In this system, the original gases are brought into a plasma tube 30 through the bubbler 32, and converted into plasma with some reactions such as ionization reaction by using electrode 34 or the like. Once the plasma is generated, the plasma gases are introduced from the plasma tube 30 into the wafer process chamber 10 through the plasma transition passage 36. In the wafer process chamber 10, the photoresist stripping process is carried out by reactive ion etching (RIE). The plasma gases are drawn downward through a gas distribution plate 40 to the surface of the wafer 20, and then the post-reaction gases are exhausted through exhaust passage 50 by an exhaust pump 60.

In general, the conduit of the gas delivery system are not built as an integral object, but built with several discrete parts connected in turn for adapting to the configuration of the system. FIG. 2 illustrates a conventional connecting pipe union structure used in the delivery passage between two discrete conduits such as the plasma tube 30 and the plasma transition passage 36 shown in FIG. 1. The gas in the conduit is flowing from the first pipe 102 to the second pipe 104 as indicated by the arrow 106. Typically, an O-ring 108 is used to seal between the two pipes and prevent leakage or contamination of gas, as well as prevent loss of proper chamber pressure.

A flow-guiding pipe 110 extends from the outlet of the first pipe 102 to the inlet of the second pipe 104. The flow-guiding pipe 110 is disposed to avoid turbulence of the gas flow around the outlet of the first pipe 102, and prevent seal damage by deleterious gas. To realize such a function, the flow-guiding pipe 110 must be disposed with a certain length extending into the first pipe 102.

However, the gas delivery system is not a totally stationary system. A pump used in the system as shown in FIG. 1 must be applied (not shown in this figure). When the pump is running and the gas flowing in the conduits, the conduits will shake, and the two pipes 102 and 104 will move relative to each other. These two pipes 102 and 104 will be bent with the O-ring seal 108 as the fulcrum. The dash lines in FIG. 2 represents a possible position of the second pipe 104 when the shake occurs. In this situation, the distance between the outlet of the flow-guiding pipe 110 and the inner wall of the second conduit pipe 104 varies as the vibration occurs (and almost touch each other as shown in the figure). If the two pipes shake violently, the amplitude of the vibration becomes large, and the flow-guiding pipe 110 will tend to grind, scratch or collide the inner wall of the second pipe 104.

Generally, the conduits of the delivery system are made of materials such as quartz, for withstanding various aggressive gases. When the grind or scratch happens, there could generate particles that will contaminate the plasma gases and then consequently the wafer positioned downstream from the two pipes 102 and 104. Extremely, the collision could cause one or both of the pipes to crack or being broken.

SUMMARY OF THE INVENTION

The present invention proposes a pipe union structure for connecting fluid conduit of a fluid delivery system. This connecting pipe union structure limits the length of the flow-guiding pipe extending into the delivery conduit, to avoid grind, scratch or collide between two pipes and reduce particle contaminates to the transition gases and the probability of crack of the conduit.

The present connecting pipe union structure comprises a first pipe, a second pipe with an inlet mounted to the outlet of the first pipe, and an inner pipe extending from the first pipe into the second pipe. The inner pipe has an outer diameter smaller than the inner diameters of the first pipe and the second pipe, and extending into the second pipe with a certain length. The length of the inner pipe extending into the second pipe is less than the proportion of the minimum distance between the inner wall of the second pipe and the outlet of the inner pipe when standstill, to the tangent value of a certain angle θ. The certain angle θ is the maximum inclined angle between the second pipe and the inner pipe.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
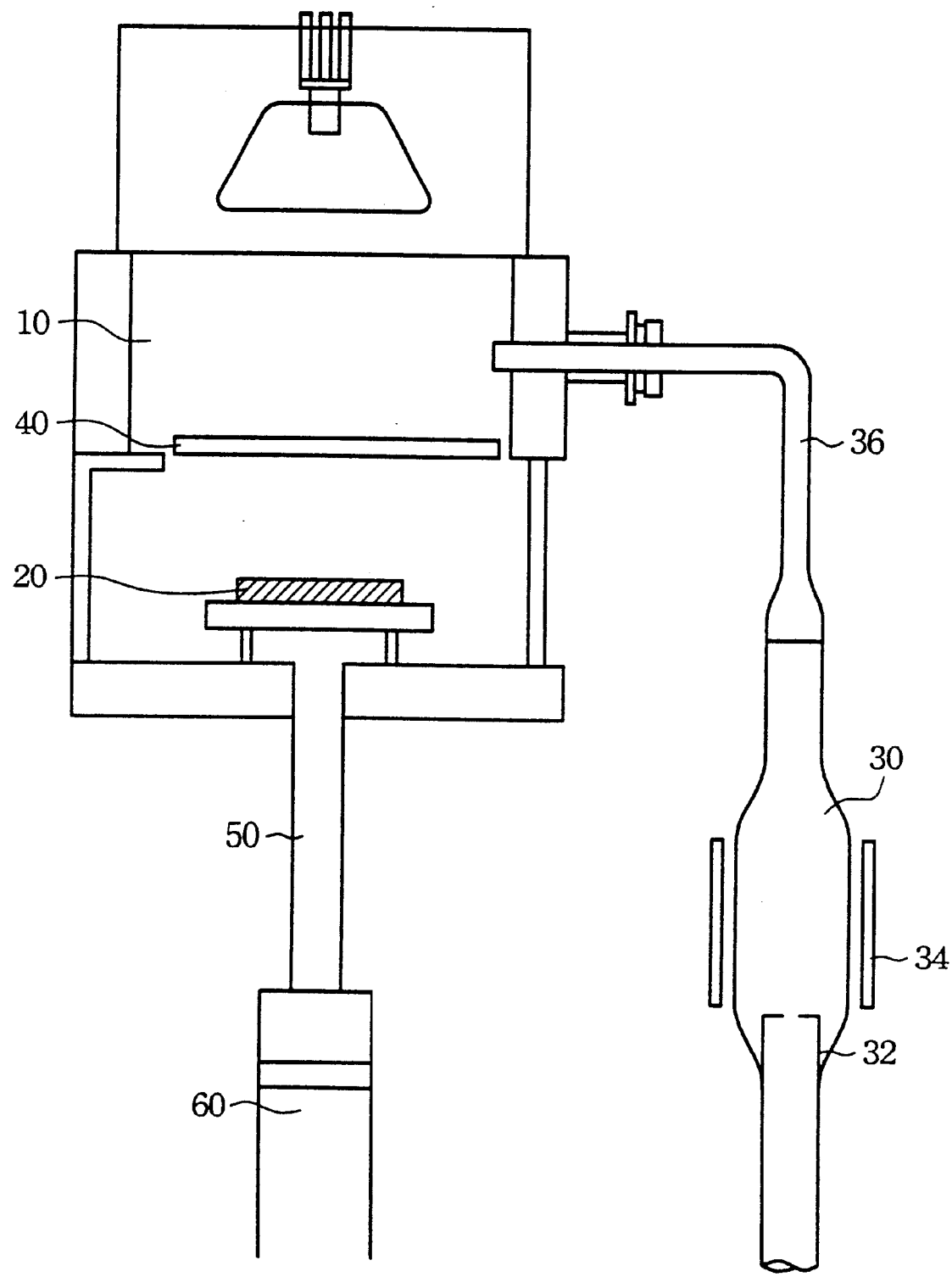
FIG. 1 is a cross-sectional view of a portion of a gas delivery system used to bring plasma gas into a photoresist-etching chamber according to the prior art.
Figure 2:
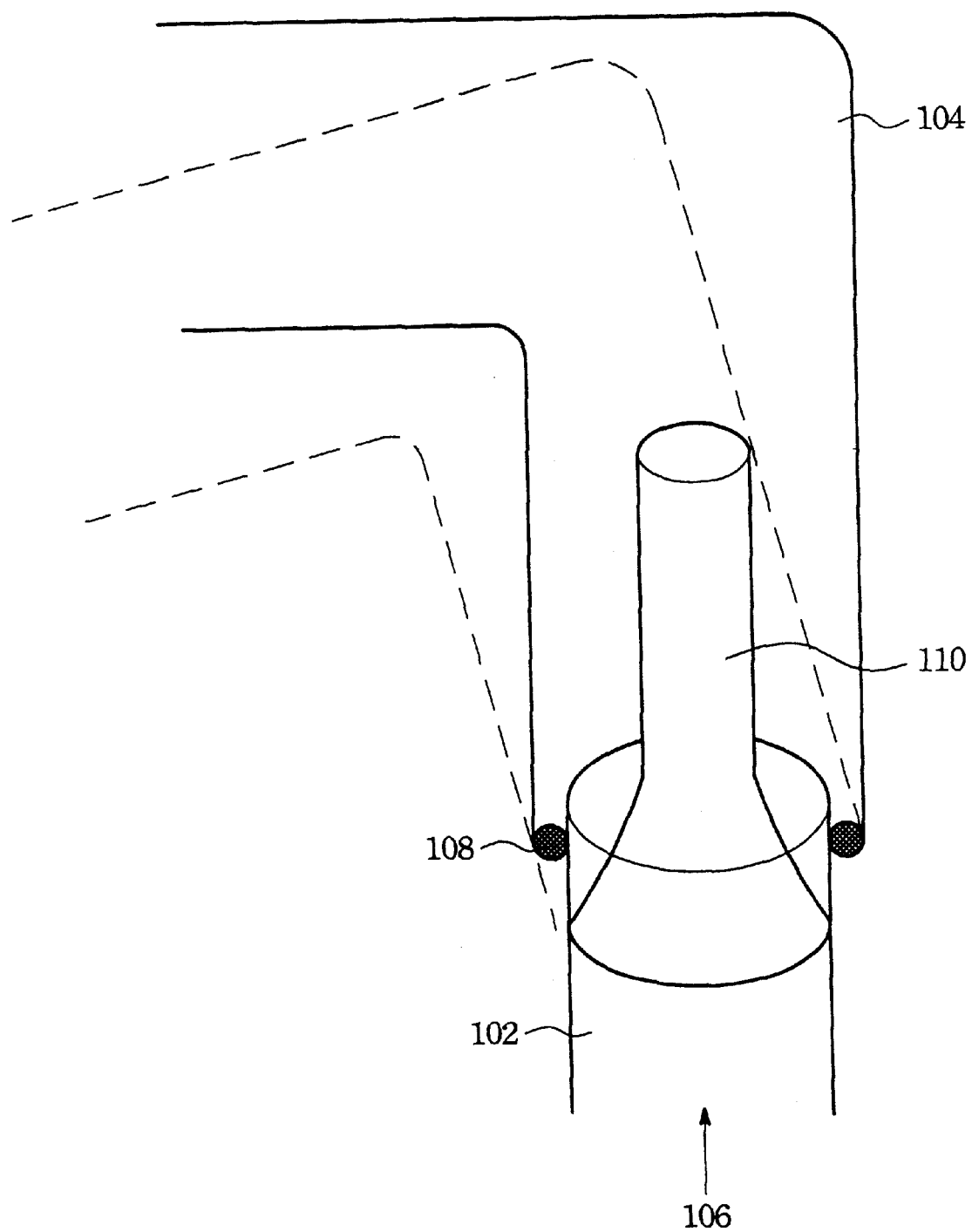
FIG. 2 is a brief view of a conventional connecting structure used in the delivery passage between two discrete channels according to the prior art.

The present invention proposes a pipe union structure for connecting conduits of a fluid delivery system. This connecting pipe union structure limits the length of the flow-guiding pipe extending into the delivery conduit, to avoid grind, scratch or collide between two pipes. The particle contaminates to the transition gases and the wafer, and the probability of crack of the conduit caused by collision can thus be substantially reduced.

According to the present invention, the connecting pipe union structure comprises a first pipe 302 mounted to the second pipe 304. The first embodiment of the present invention is illustrates in FIG. 3. As shown in this figure, the outer diameter of the outlet of the first pipe 302 is smaller than the inlet of the inner diameter of the second pipe 304, such that the outlet of the first pipe 302 is mounted in the inlet of the second pipe 304. Typically, a seal, such as an O-ring 308, is deposed between the two pipes 302 and 304, to prevent leakage or contamination of gas, as well as to prevent loss of proper channel pressure.

In addition to the first and second pipes 302 and 304, the connecting pipe union structure further comprises an inner pipe 310 having an outer diameter smaller than the inner diameters of the first pipe and the second pipe. The inner pipe 310 is mounted with its inlet in the first pipe 302 and its outlet extending into the second pipe 304, to prevent turbulence of the gas flow and damage of the seal by deleterious gas.

As mentioned above in the background of the invention, the conduits will shake during fluid transition, and the inner pipe 310 could grind, scratch or collide with the inner wall of the second pipe 304. To avoid this grind, scratch or collide happening when the pipe union structure shakes, the length of the inner pipe 310 that extends into the second pipe 304 should be limited. The limitation of the length of the inner pipe should base on the amplitude of the vibration angle of the second pipe 304 relative to the inner pipe 310 caused by the conduits shake. The method to make this limitation suggested by the present is described as follows.

Figure 3:
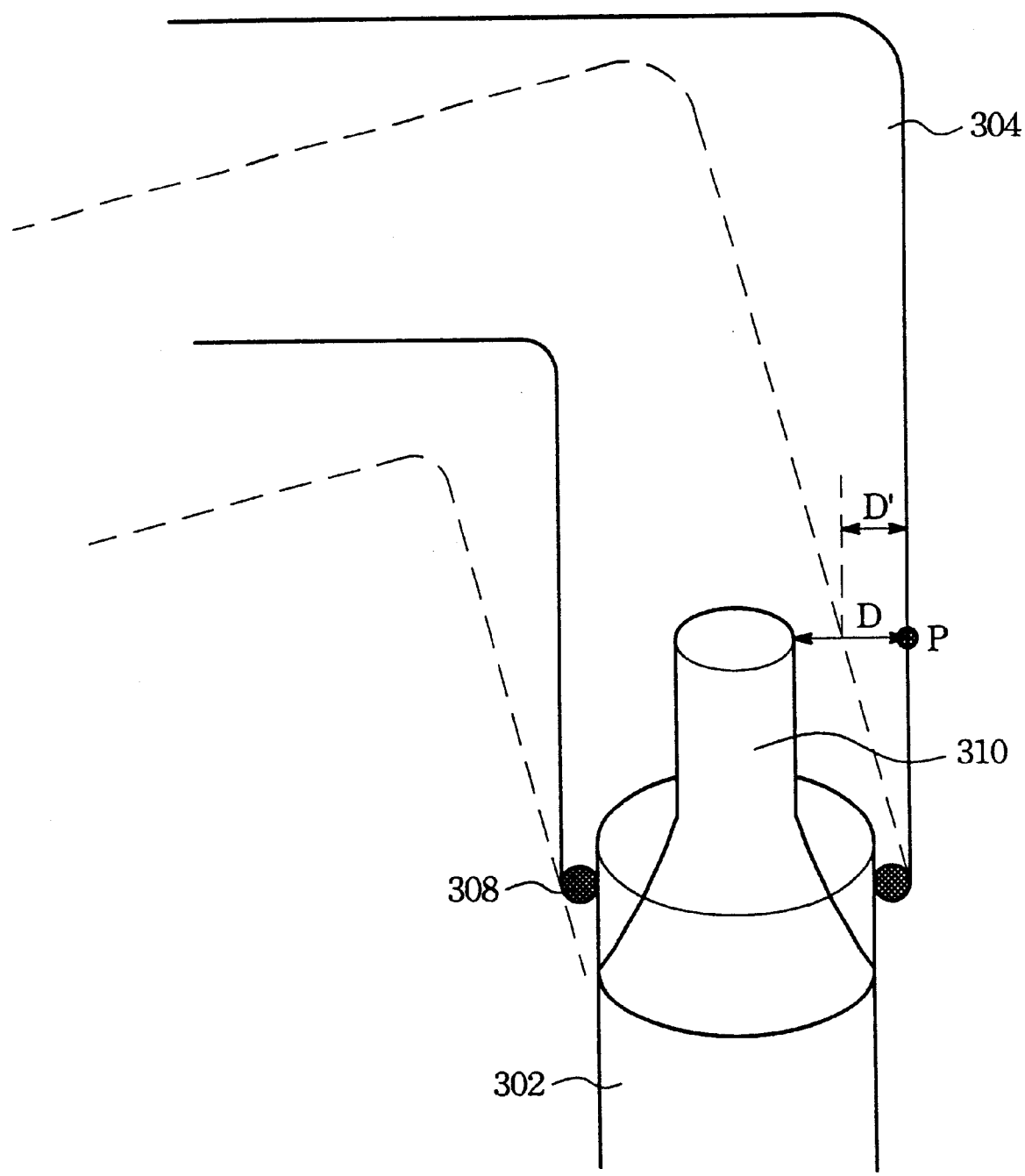
FIG. 3 is a brief view of the connecting structure used in the delivery passage between two discrete channels according to the first embodiment of the present invention.
Figure 4:
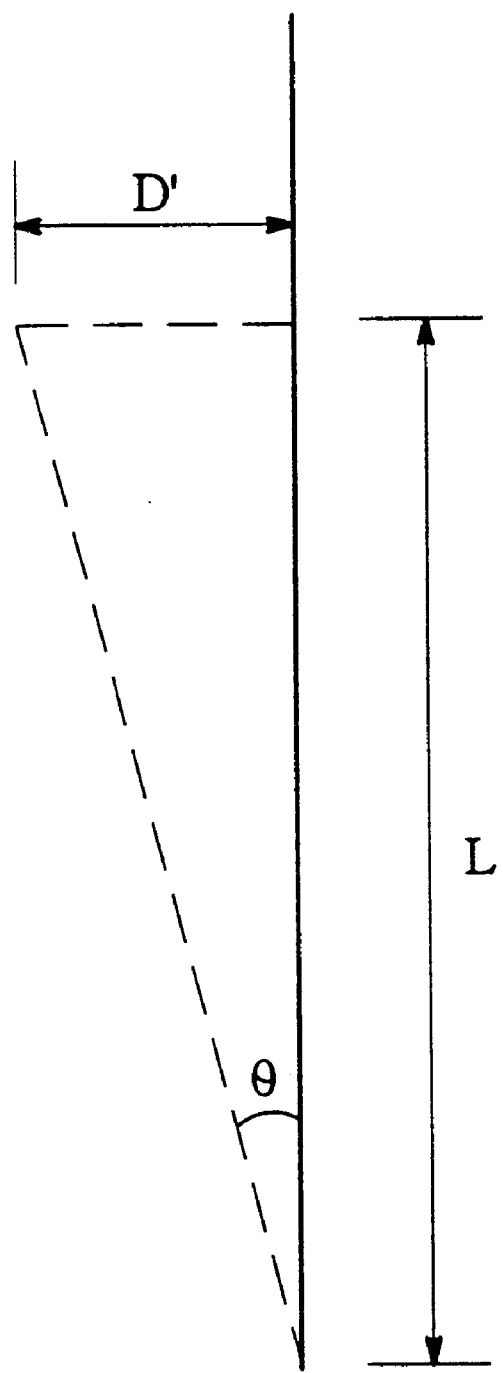
FIG. 4 is a geometry graph of the relation between the extending length, the distance between two conduits, and the inclined angle.

First, set the extending length of the inner pipe 310 into the second pipe 304 to be L, and the distance between the outlet of the inner pipe 310 and the inner wall of the second pipe 304 to be D. Accordingly, D should be larger than a maximum displacement D' to make sure of no contact during shaking, wherein D' is the maximum shaking amplitude of a point P on the wall of the second pipe 304 in approximately the same level as the outlet of the inner pipe 310, as shown in FIG. 3. Referring to FIG. 4, when the second pipe 304 shakes during operation, the maximum inclined angle between the second pipe 304 and the inner pipe 310 is evaluated to be θ. Consequently, the displacement D' is equal to the product of the tangent value of the angle θ with the extending length L, that is, D'=L tan θ. Thus, the product of the tangent value of the angle θ and the extending length of the inner pipe 310 L, should be less than D, the distance between the outlet of the inner pipe 310 and the inner wall of the second pipe 304, that is, half of the difference between the outer diameter of the inner pipe 310 and the inner diameter of the second pipe 304. In the other expression, the extending length L should be less than the proportion of the distance D to the tangent value of the angle θ. It is noticed that the tangent value of θ can be approached by the sine value when the angle is very small.

Figure 5:
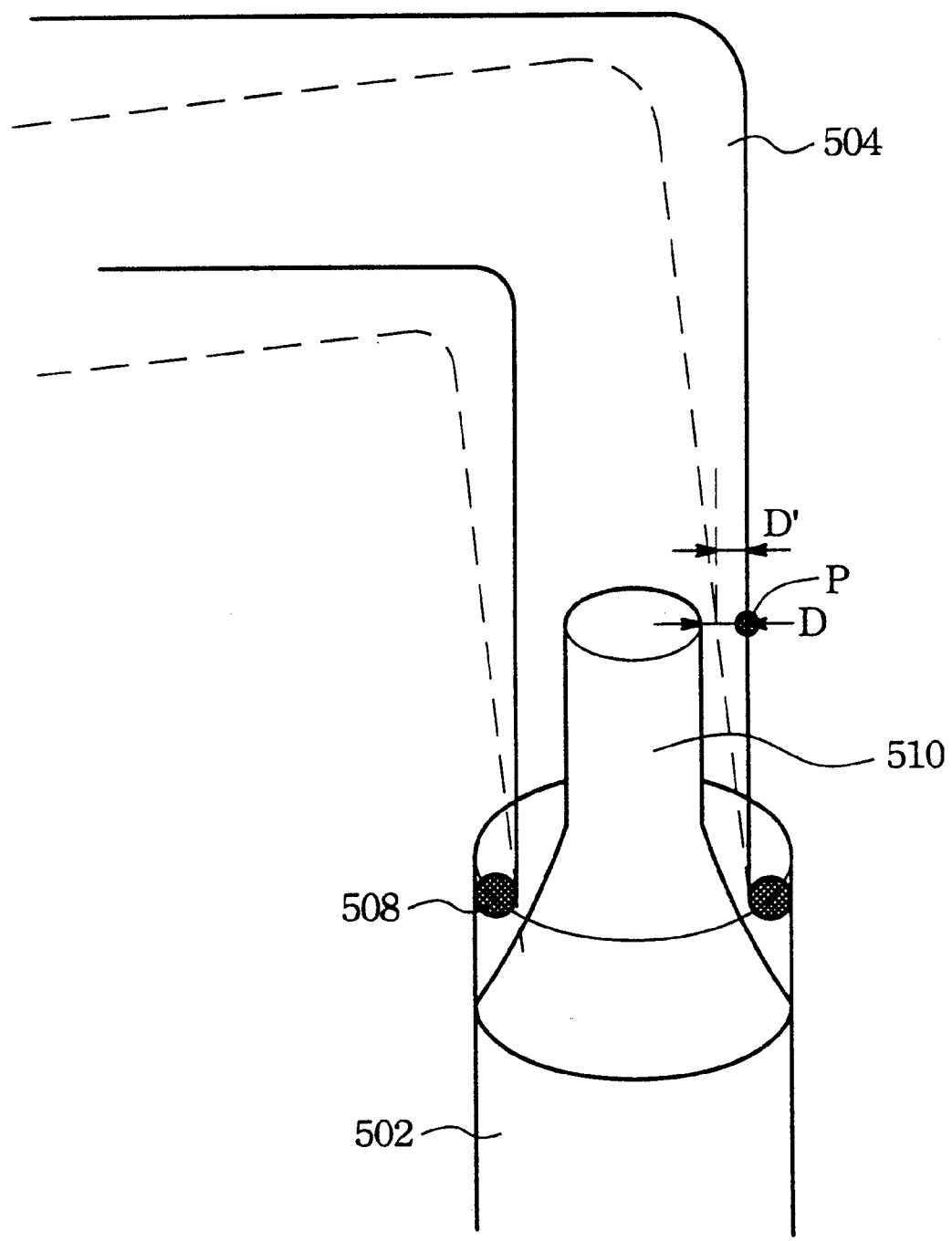
FIG. 5 is a brief view of the connecting structure used in the delivery passage between two discrete channels according to the second embodiment of the present invention.

Alternatively, FIG. 5 shows the second embodiment of the present invention. In this embodiment, the inner diameter of the outlet of the first pipe 502 is larger than the outer diameter of the inlet of the second pipe 504, such that the inlet of the second pipe 502 is mounted in the outlet of the first pipe 504. A seal, such as an O-ring 508, is deposed between the two pipes 502 and 504, to prevent leakage or contamination of gas, as well as to prevent loss of proper channel pressure.

In addition to the first and second pipes 502 and 504, the connecting pipe union structure further comprises an inner pipe 510 having an outer diameter smaller than the inner diameters of the first pipe 502 and the second pipe 504. The inner pipe 510 is mounted with its inlet in the first pipe 502 and its outlet extending into the second pipe 504, to prevent turbulence of the gas flow and damage of the seal.

As recounted in the first embodiment, to avoid grind, scratch or collide of the inner pipe 510 to the inner wall of the second pipe 504 when the pipe union structure shakes, the length of the inner pipe 510 that extends into the second pipe 504 should be limited. Set the extending length of the inner pipe 510 into the second pipe 504 to be L, the distance between the outlet of the inner pipe 510 and the inner wall of the second pipe 504 to be D. Accordingly, D should be larger than the maximum shaking amplitude D' of a point P on the wall of the second pipe 504 in approximately the same level as the outlet of the inner pipe 510, in order to make sure of no contact during shake. Referring again to FIG. 4, when the second pipe 504 shakes during operation, the maximum inclined angle between the second pipe 504 and the inner pipe 510 is evaluated to be θ. Therefore, the displacement D' is equal to the product of the tangent value of the angle θ to the extending length L, that is, D'=L tan θ. Thus, the product of the tangent value of θ to L, should be shorter than D, or half of the difference between the inner diameter of the second pipe and the outer diameter of the inner pipe. The extending length L is less than the proportion of the distance D to the tangent value of the angle θ.

In accordance with the embodiments described above, the present invention proposes a pipe union connecting structure that limits the length of the inner pipe 310(510) extending into the second pipe 304(504). This limitation can avoid grind, scratch or collide between two pipes. The particle contaminates to the transition gases and the wafer, and the probability of crack of the pipe caused by collision can therefore be substantially reduced.

In practice, the pipe union connecting structure of the present invention can be applied to various delivery systems of different type or using in different wafer processing chamber. Especially, the present invention is applied to the Gasonics L3510 plasma photoresist-stripping system between the plasma tube and the delivery channel. In this situation, the inner pipe for flow guiding to prevent turbulence should be limited to the maximum extending length of about 10 mm.

As is understood by a person who is skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A pipe union structure for a fluid channel of a semiconductor apparatus, said structure comprising:
   a first pipe having an outlet with an inner diameter;
   a second pipe having an inlet with an inner diameter and an outer diameter, said inlet flexibly, coaxially coupled to said outlet of said first pipe so that said second pipe can be displaced by an angle (θ) relative to said first pipe;
   a seal disposed between said outlet of said first pipe and said inlet of said second pipe;
   an inner pipe having an inlet and an outlet, said outlet of said inner pipe having an outer diameter smaller than each of the inner diameters of said outlet of said first pipe and said inlet of said second pipe, said inlet of said inner pipe connected to said outlet of said first pipe, said inner pipe extended into said inlet of said second pipe a longitudinal distance;
   said longitudinal distance being less than a transverse distance between said second pipe and said outlet of said inner pipe divided by a tangent value of the angle (θ).

2. The structure according to claim 1, wherein said seal is an O-ring seal.

3. The structure according to claim 1, wherein the tangent value of the angle ($\theta$) can be approximated by a sine value of the angle ($\theta$).

4. The structure according to claim 1, wherein said second pipe and said inner pipe are disposed coaxially.

5. The structure according to claim 4, wherein the transverse distance equals one-half a difference between the inner diameter of said second pipe and the outer diameter of said outlet of said inner pipe.

6. The structure according to claim 1, wherein the longitudinal distance is limited to 10 mm.

7. A pipe union structure for a fluid channel of a semiconductor apparatus, said structure comprising:

a first pipe having an outlet with an inner diameter;

a second pipe having an inlet with an inner diameter and an outer diameter, said inlet flexibly coaxially coupled to said outlet of said first pipe so that said second pipe can be displaced by a maximum angle ($\theta$) relative to said first pipe;

a seal disposed between said outlet of said first pipe and said inlet of said second pipe;

an inner pipe having an inlet and an outlet, said outlet of said inner pipe having an outer diameter smaller than each of the inner diameters of said first and second pipes, said inlet of said inner pipe connected to said outlet of said first pipe, said inner pipe extended into said inlet of said second pipe a longitudinal distance;

said longitudinal distance being less than a transverse distance between said second pipe and said outlet of said inner pipe divided by a tangent value of the angle ($\theta$).

8. The structure according to claim 7, wherein said seal is an O-ring seal.

9. The structure according to claim 7, wherein the tangent value of the angle ($\theta$) can be approximated by a sine value of the angle ($\theta$).

10. The structure according to claim 7, wherein said second pipe and said inner pipe are disposed coaxially.

11. The structure according to claim 7, wherein the longitudinal distance is limited to 10 mm.

12. The structure according to claim 10, wherein the transverse distance equals one-half a difference between the inner diameter of said second pipe and the outer diameter of said outlet of said inner pipe.

* * * * *